(12) United States Patent
Zhang et al.

(10) Patent No.: US 11,355,614 B2
(45) Date of Patent: Jun. 7, 2022

(54) THIN FILM TRANSISTOR, METHOD FOR PREPARING THE SAME, DISPLAY SUBSTRATE AND DISPLAY DEVICE

(71) Applicants: HEFEI BOE DISPLAY TECHNOLOGY CO., LTD., Hefei (CN); BOE TECHNOLOGY GROUP CO., LTD., Beijing (CN)

(72) Inventors: Ji Zhang, Beijing (CN); Huiming Wang, Beijing (CN); Lin Chen, Beijing (CN); Jincheng Gao, Beijing (CN)

(73) Assignees: HEFEI BOE DISPLAY TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/760,410

(22) PCT Filed: Oct. 17, 2018

(86) PCT No.: PCT/CN2018/110637
§ 371 (c)(1),
(2) Date: Apr. 29, 2020

(87) PCT Pub. No.: WO2019/148892
PCT Pub. Date: Aug. 8, 2019

(65) Prior Publication Data
US 2020/0343356 A1  Oct. 29, 2020

(30) Foreign Application Priority Data
Feb. 1, 2018 (CN) .......................... 201810101958.8

(51) Int. Cl.
*H01L 29/49* (2006.01)
*H01L 21/02* (2006.01)
*H01L 27/12* (2006.01)
*H01L 29/51* (2006.01)
*H01L 29/66* (2006.01)

(52) U.S. Cl.
CPC ...... *H01L 29/4908* (2013.01); *H01L 21/0234* (2013.01); *H01L 21/02178* (2013.01);
(Continued)

(58) Field of Classification Search
CPC ........... H01L 29/4908; H01L 21/02178; H01L 21/0234; H01L 27/1214; H01L 29/513;
(Continued)

(56) References Cited

U.S. PATENT DOCUMENTS

2006/0063014 A1* 3/2006 Forray ................ C08L 2666/02
428/448
2008/0135891 A1 6/2008 Arias et al.
(Continued)

FOREIGN PATENT DOCUMENTS

CN    101241971 A    8/2008
CN    102150292 A    8/2011
(Continued)

OTHER PUBLICATIONS

ISA State Intellectual Property Office of the People's Republic of China, International Search Report Issued in Application No. PCT/CN2018/110637, dated Jan. 16, 2019, WIPO, 15 pages. (Submitted with Partial Translation).
(Continued)

*Primary Examiner* — Mohammed R Alam
(74) *Attorney, Agent, or Firm* — McCoy Russell LLP

(57) ABSTRACT

The present disclosure provides a thin film transistor, a method for preparing the same, a display substrate, and a display device. The thin film transistor includes a gate electrode, a semiconductor layer, and a gate insulation layer arranged between the gate electrode and the semiconductor layer, and the gate insulation layer includes a metal oxide
(Continued)

layer and a modified layer formed through self-assembling on a side of the metal oxide layer away from the gate electrode and.

17 Claims, 3 Drawing Sheets

(52) U.S. Cl.
CPC ........ *H01L 27/1214* (2013.01); *H01L 29/513* (2013.01); *H01L 29/517* (2013.01); *H01L 29/66765* (2013.01)

(58) Field of Classification Search
CPC ............. H01L 29/517; H01L 29/66765; H01L 21/02343; H01L 21/02359; H01L 21/02362; H01L 29/786; H01L 29/518; H01L 29/66742
See application file for complete search history.

(56) References Cited

U.S. PATENT DOCUMENTS

| | | | | |
|---|---|---|---|---|
| 2008/0185677 | A1* | 8/2008 | Yang | .................. H01L 51/0525 257/529 |
| 2010/0289024 | A1 | 11/2010 | Ito | |
| 2011/0180907 | A1 | 7/2011 | McConnell | |
| 2012/0138965 | A1 | 6/2012 | Choi et al. | |
| 2016/0005881 | A1* | 1/2016 | Fujii | ................... H01L 29/1606 257/24 |
| 2021/0262095 | A1* | 8/2021 | Wang | ...................... C23C 18/32 |

FOREIGN PATENT DOCUMENTS

| | | | |
|---|---|---|---|
| CN | 102881828 | A | 1/2013 |
| CN | 103413832 | A | 11/2013 |
| CN | 103700710 | A | 4/2014 |
| CN | 104332559 | A | 2/2015 |
| CN | 104730137 | A | 6/2015 |

OTHER PUBLICATIONS

State Intellectual Property Office of the People's Republic of China, Office Action and Search Report Issued in Application No. 201810101958.8, dated May 27, 2020, 18 pages. (Submitted with Partial Translation).
European Patent Office, Extended European Search Report Issued in Application No. 18903206.3, dated Sep. 23, 2021, Germany, 7 pages.

* cited by examiner

THIN FILM TRANSISTOR, METHOD FOR PREPARING THE SAME, DISPLAY SUBSTRATE AND DISPLAY DEVICE

CROSS-REFERENCE TO RELATED APPLICATIONS

This application is the U.S. national phase of PCT Application No. PCT/CN2018/110637 filed on Oct. 17, 2018, which claims a priority to Chinese Patent Application No. 201810101958.8 filed on Feb. 1, 2018, the disclosures of which are incorporated in their entirety by reference herein.

TECHNICAL FIELD

The present disclosure relates to the field of display, in particular to a thin film transistor, a method for preparing the same, a display substrate, and a display device.

BACKGROUND

A thin film transistor is a field effect semiconductor device, including several important components, such as a substrate, a gate electrode, a gate insulation layer, an active layer, a source electrode and a drain electrode.

With the development of display technology toward high resolution, large size, and high frame rate, there is a higher demand for the drive capability of the thin film transistor.

There is no solution in the related art to enable the thin film transistor to obtain a higher on-state current and to improve the charging efficiency of the thin film transistor.

SUMMARY

The present disclosure provides a thin film transistor, including a gate electrode, a semiconductor layer, and a gate insulation layer arranged between the gate electrode and the semiconductor layer, in which the gate insulation layer includes a metal oxide layer and a modified layer formed through self-assembling on a side of the metal oxide layer away from the gate electrode and.

For example, a material of the modified layer is silazane or chlorosilane.

For example, the silazane is hexamethyldisilazane.

For example, the gate insulation layer further includes an adhesion layer located between the modified layer and the metal oxide layer.

For example, a material of the adhesion layer is polymethylsilsesquioxane.

For example, the adhesion layer has a thickness of 10 nm to 20 nm, and the modified layer has a thickness of 10 nm or less.

For example, a material of the metal oxide layer has a dielectric constant of 10 or more, and the metal oxide layer has a thickness of less than 200 nm; or a material of the metal oxide layer has a dielectric constant of 5 to 10, and the metal oxide layer has a thickness of 5 nm to 50 nm.

For example, the material of the metal oxide layer having the dielectric constant of 10 or more is hafnium oxide, zirconium oxide, tantalum oxide, cerium oxide, or gadolinium oxide.

For example, the material of the metal oxide layer having the dielectric constant of 5 to 10 is aluminum oxide.

For example, the material of the gate electrode includes aluminum.

For example, a via hole for exposing the gate electrode is provided in the gate insulation layer, and the semiconductor layer fills the via hole in the gate insulation layer.

For example, the thin film transistor further includes a base substrate, a source electrode, and a drain electrode.

For example, the gate insulation layer has a capacitance of 70 $nF/cm^2$ to 700 $nF/cm^2$.

An another embodiment of the present disclosure provides a method for preparing a thin film transistor, including: providing a base substrate; forming a gate electrode on the base substrate; forming a gate insulation layer; and forming a semiconductor layer on a gate insulation layer, an orthogonal projection of the semiconductor layer on the base substrate falling within an orthogonal projection of the gate electrode on the base substrate; and forming a source electrode and a drain electrode on a base substrate on which the semiconductor layer is formed to obtain a thin film transistor, in which the forming the gate insulating layer includes: forming a metal oxide layer on a surface of the gate electrode; and forming a modified layer through self-assembling on a side of the metal oxide layer away from the gate electrode.

For example, the forming the modified layer includes: treating a surface of the metal oxide layer away from the gate electrode with silazane or chlorosilane, to form the modified layer.

For example, a material of the modified layer is hexamethylsilazane, and the forming the modified layer includes: treating a surface of the metal oxide away from the gate electrode with hexamethyldisilazane vapor or a solution containing hexamethyldisilazane, to form the modified layer.

For example, the forming the gate insulation layer further includes: after forming the metal oxide layer on the surface of the gate electrode and before forming the modified layer, forming an adhesion layer on a surface of the metal oxide layer away from the gate electrode; the forming the modified layer includes forming a modified layer on a surface of the adhesion layer away from the gate electrode.

For example, a material of the adhesion layer is polymethylsilsesquioxane, and the forming of the gate insulation layer includes: forming a metal oxide layer on a surface of the gate electrode; coating a solution containing polymethylsilsesquioxane on a surface of the metal oxide layer away from the gate electrode and then vacuum drying to form the adhesion layer; performing plasma treatment on the adhesion layer to obtain a hydrophilic surface; and treating the hydrophilic surface with silazane or chlorosilane to form the modified layer.

For example, the metal oxide layer is an aluminum oxide layer, and forming the metal oxide layer on the surface of the gate electrode includes: forming an aluminum oxide layer on the surface of the gate electrode by oxygen plasma direct oxidation, PECVD, or atomic layer deposition.

For example, the material of the gate electrode is aluminum, the material of the metal oxide layer is aluminum oxide, and the forming the metal oxide layer on the surface of the gate electrode includes: forming an aluminum oxide layer on the surface of the gate electrode by oxygen plasma oxidation.

For example, the forming the aluminum oxide layer on the surface of gate electrode by atomic layer deposition includes: treating the gate electrode with trimethylaluminum, to adsorb trimethylaluminum on the surface of the gate electrode; removing excess trimethylaluminum with an inert gas; and oxidizing the trimethylaluminum adsorbed on the surface of the gate electrode by oxygen to form an aluminum oxide layer.

For example, the forming the gate insulation layer further includes: forming a via hole for exposing the gate electrode in the gate insulation layer; the forming the semiconductor layer includes depositing a semiconductor thin film on the modified layer to form the semiconductor layer filling the via hole.

An still another embodiment of the present disclosure provides a display substrate, including the above thin film transistor.

An still another the present disclosure further provides a display device, including the above display substrate.

DETAILED DESCRIPTION

In order to better understand the present disclosure, the specific embodiments of the present disclosure will be described below in combination with Examples, but it should be understood that these descriptions are merely used to further illustrate the features and advantages of the present disclosure and are not intended to limit the present disclosure.

The technical problem to be solved by the present disclosure is to provide a thin film transistor, a method for preparing the same, a display substrate, and a display device. The thin film transistor has a high on-state current and greatly reduces the driving voltage of the gate electrode at the same time.

An embodiment of the present disclosure provides a thin film transistor, including a gate electrode, a semiconductor layer, and a gate insulation layer arranged between the gate electrode and the semiconductor layer, and the gate insulation layer includes a metal oxide layer and a modified layer formed through self-assembling on a side of the metal oxide layer away from the gate electrode.

Figure 1:
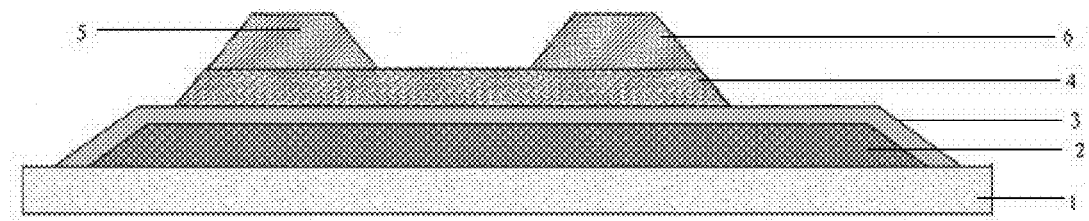
FIG. 1 is a schematic view showing a thin film transistor according to one embodiment of the present disclosure.
Figure 2:
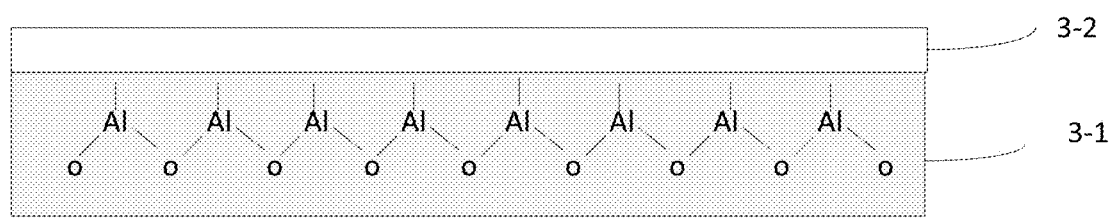
FIG. 2 is a schematic view showing a gate insulation layer according to some embodiments of the present disclosure.

For example, referring to FIG. 1, the structure of a thin film transistor includes: a base substrate 1, a gate electrode 2 arranged on the base substrate 1, a gate insulation layer 3 arranged on a surface of the gate electrode 2, a semiconductor layer 4 arranged on the gate insulation layer 3, and a source electrode 5 and a drain electrode 6 arranged on the semiconductor layer 4. Further, as shown in FIG. 2, the gate insulation layer 3 includes a metal oxide layer 3-1 and a modified layer 3-2 located on a side of the metal oxide layer away from the gate electrode and formed through self-assembling.

In some embodiments of the present disclosure, a material of the metal oxide layer having a dielectric constant of 10 or more, and the metal oxide layer has a thickness of less than 200 nm. In this case, the material of the metal oxide layer may be hafnium oxide, zirconium oxide, titanium oxide, tantalum oxide, cerium oxide, or gadolinium oxide. Alternatively, a material of the metal oxide layer has a dielectric constant of 5 to 10, and the metal oxide layer has a thickness of 5 nm to 50 nm. In this case, the material of the metal oxide layer may be aluminum oxide.

For example, the material of the modified layer may be silazane or chlorosilane. The modified layer can form a chemical bonding with the metal oxide. It has a modification effect on the metal oxide layer and has high stability. Especially, after the surface of the metal oxide layer is modified by silazane or chlorosilane, an array of the dense and ordered alkyl group can effectively prevent the carrier from tunneling to the gate insulation layer, so that the threshold voltage drift phenomenon can be effectively suppressed. The modified layer can have a thickness of 10 nm or less.

When the material of the metal oxide layer is aluminum oxide, there are high-density hydroxyl groups and $Al^{3+}$ orbitals on the surface of the aluminum oxide, which can form chemical bonds with silicon atoms in silazane or chlorosilane. The gate insulation layer composed of an aluminum oxide layer and a modified layer has good dielectric properties, and an array of the dense and ordered alkyl group of the modified layer located on the surface of the aluminum oxide layer can effectively prevent the carrier from tunneling to the gate insulation layer, so that the threshold voltage drift phenomenon can be effectively suppressed.

In some embodiments of the present disclosure, the silazane used as the material of the modified layer may be hexamethyldisilazane (HMDS). By selecting different types of silazane, the structure of the alkyl side chain can be adjusted, and the surface of the metal oxide layer can be modified differently, to obtain excellent properties of gate insulation layer.

Figure 3:
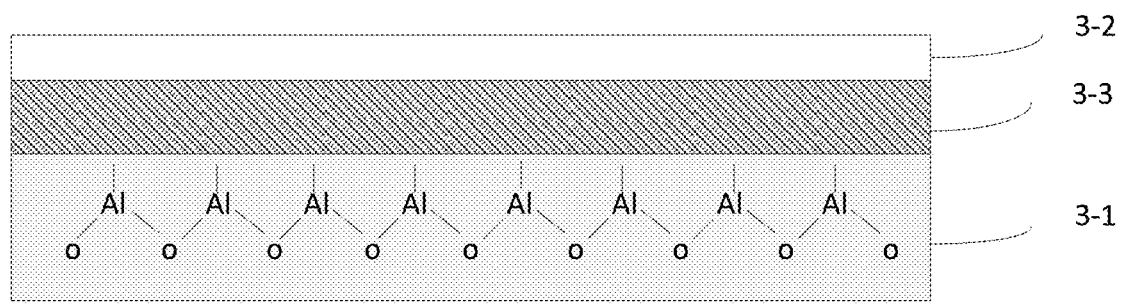
FIG. 3 is a schematic view showing a gate insulation layer according to some embodiments of the present disclosure.

For example, the gate insulation layer includes an aluminum oxide layer and a modified layer formed of hexamethyldisilazane. For example, as shown in FIG. 2, 3-1 is an aluminum oxide layer and 3-2 is a modified layer formed of hexamethyldisilazane.

The structural formula of hexamethyldisilazane is shown in the following formula (I):

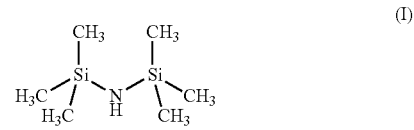

Chlorosilane is shown in formula (II):

wherein n is an even number between 8 and 18.

In some embodiments of the present disclosure, the gate insulation layer further includes an adhesion layer located between the modified layer and the metal oxide layer. The adhesion layer can have a thickness of 10 nm to 20 nm. The adhesion layer can improve the bonding strength between the metal oxide layer and the modified layer, and can improve the corrosion resistance.

In some embodiments of the present disclosure, the material of the adhesion layer may be polymethylsilsesquioxane (PMSQ). The structural formula of polymethylsilsesquioxane (PMSQ) is shown in the following formula (III):

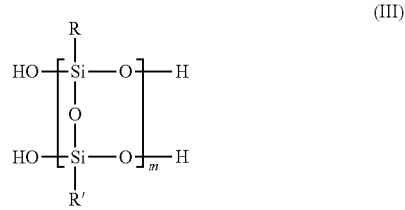

wherein R and R' are alkyl or aryl; m is a positive integer and represents the degree of polymerization.

For example, the gate insulation layer includes an aluminum oxide layer, a polymethylsilsesquioxane layer, and a hexamethyldisilazane layer arranged in order. For example, as shown in FIG. 3, 3-1 is an aluminum oxide layer, 3-2 is a modified layer formed of hexamethyldisilazane, and 3-3 is an adhesion layer formed of polymethylsilsesquioxane.

For example, the material of the gate electrode includes aluminum.

For example, the gate insulation layer is provided with a via hole for exposing the gate electrode, and the semiconductor layer fills the via hole in the gate insulation layer, so that a source electrode and a drain electrode that are subsequently deposited can be prevented from directly contacting the gate electrode.

In the embodiments of the present disclosure, the capacitance of the gate insulation layer and the on-state current can be effectively improved by reducing the thickness of the gate insulation layer or by increasing the dielectric constant of the gate insulation layer.

After experimental tests, in the thin film transistor according to the embodiments of the present disclosure, the capacitance of the gate insulation layer can reach 70 nF/cm$^2$ to 700 nF/cm$^2$.

Therefore, in the thin film transistor of the present disclosure, the gate insulation layer includes a metal oxide layer and a modified layer located on a side of the metal oxide layer away from the gate, and these change the material and structure of the gate insulation layer, thereby improving the capacitance of the thin film transistor, obtaining a higher on-state current, and improving charging efficiency. The modified layer has a protective effect on the metal oxide layer and can improve the adhesion between the metal oxide layer and the semiconductor layer. The preparation method of the gate insulation layer is simple and convenient, and is conducive to extensive application in the process of preparing a thin film transistor. Experimental results show that when the gate insulation layer is used in the thin film transistor of the present disclosure, the capacitance can reach 70 nF/cm$^2$ to 700 nF/cm$^2$. As compared with a thin film transistor using a thin film such as silicon nitride as a gate insulation layer, the capacitance of the thin film transistor disclosed in the present disclosure is increased by almost two orders of magnitude, and it is easy to operate at a voltage less than 5 volt.

Figure 4:
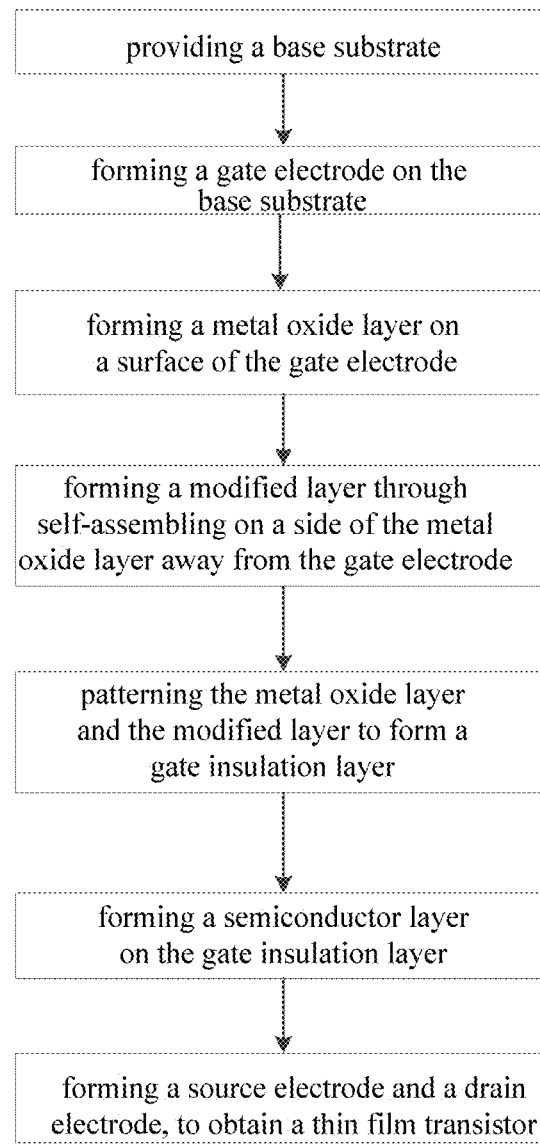
FIG. 4 is a flow chart showing the preparation of the thin film transistor according to the present disclosure.

An embodiment of the present disclosure also provides a method for preparing a thin film transistor, as shown in FIG. 4, for example, including: providing a base substrate; forming a gate electrode on the base substrate; forming a gate insulation layer: forming a semiconductor layer on the gate insulation layer, an orthogonal projection of the semiconductor layer on the base substrate falling within an orthogonal projection of the gate electrode on the base substrate; and forming a source electrode and a drain electrode on a base substrate on which a semiconductor layer is formed, to obtain a thin film transistor, in which the forming the gate insulating layer includes forming a metal oxide layer on a surface of the gate electrode; and forming a modified layer through self-assembling on a side of the metal oxide layer away from the gate electrode.

Hereinafter, a method for preparing a thin film transistor according to an embodiment of the present disclosure is exemplified. The method for preparing a thin film transistor according to the embodiment of the present disclosure includes, for example, the following steps S1 to S5.

S1: providing a base substrate.

The base substrate may be a glass substrate or a flexible substrate.

S2: forming a gate electrode on the base substrate.

The material of the gate can be Cu, Ti, Cr, or Al, etc.

The forming the gate electrode on the base substrate may include depositing a gate metal layer on the base substrate, and patterning the gate metal layer, to obtain a gate electrode.

If it is necessary to use a via hole in the gate electrode for subsequent connection, the patterning process can be performed in the following manner, but is not limited thereto.

A layer of photoresist is coated on the gate metal layer, and the photoresist is exposed by using a mask to form a photoresist unreserved region, a photoresist partially reserved region and a photoresist reserved region. The photoresist reserved region corresponds to a region in which the pattern of the gate electrode is located, the photoresist partially reserved region corresponds to a region in which the pattern of the via hole is located, and the photoresist unreserved region corresponds to a region outside of the above pattern; development processing is performed, so that the photoresist in the photoresist unreserved region is completely removed, and the thickness of the photoresist in the photoresist reserved region remains unchanged; and the gate metal film of the photoresist unreserved region is completely etched away by an etching process, the photoresist in the photoresist partially reserved region is ashed away to form a photoresist pattern for protecting the via hole; and the remaining photoresist is stripped to form a pattern of the gate layer.

S3: the forming the gate insulating layer includes: forming a metal oxide layer on a surface of the gate electrode; and forming a modified layer through self-assembling on a side of the metal oxide layer away from the gate electrode, to obtain a gate insulation layer.

In the process of forming the metal oxide layer on the surface of the gate electrode, for example, the material of the metal oxide layer may be a material having a dielectric constant of 10 or more, and the metal oxide layer is formed to have a thickness of less than 200 nm. In this case, the material of the metal oxide layer may be hafnium oxide, zirconium oxide, titanium oxide, tantalum oxide, cerium oxide, or gadolinium oxide. Alternatively, the material of the metal oxide layer may be a material having a dielectric constant of 5 to 10, and the metal oxide layer is formed to have a thickness of 5 to 50 nm. In this case, the material of the metal oxide layer may be aluminum oxide.

When the material of the metal oxide layer is aluminum oxide, the forming the metal oxide layer on the surface of the gate electrode may include forming an aluminum oxide layer on the surface of the gate electrode by oxygen plasma direct oxidation, PECVD, or atomic layer deposition. Depending on the metal used for the gate electrode, different methods are used to form the aluminum oxide layer.

When the gate electrode is aluminum, an aluminum oxide layer is formed on the surface of the gate electrode by oxygen plasma oxidation. The forming the aluminum oxide layer on the surface of the gate by oxygen plasma oxidation may alternatively include directly oxidizing the gate electrode in an oxygen plasma environment, to form an aluminum oxide layer on the surface of the gate electrode. By adjusting the work power and oxygen partial pressure of the oxygen plasma, different degrees of oxidation can be achieved to control the thickness of the aluminum oxide layer. The aluminum oxide layer may have a thickness of 5 nm to 50 nm.

When the gate electrode is made of aluminum, and the gate insulation layer includes an aluminum oxide layer and a modified layer located on the side of the aluminum oxide layer away from the gate electrode and formed through self-assembling, the process of forming an aluminum oxide layer on the surface of the gate electrode by oxygen plasma oxidation can be well compatible with the process of preparing the gate electrode. After the aluminum gate electrode is formed, a dense aluminum oxide layer is thermally grown with the help of oxygen plasma, thereby eliminating several complicated PECVD steps required by the deposition of the gate insulation layer. Moreover, the aluminum oxide layer and the aluminum gate electrode have a good contact, which can reduce the stress of the aluminum gate electrode.

The gate electrode may also be a metal other than aluminum. In this case, an aluminum oxide layer may be formed on the surface of the gate electrode by PECVD or atomic layer deposition. For example, the method of forming the aluminum oxide layer on the surface of the gate electrode by atomic layer deposition method includes: treating the gate electrode with trimethylaluminum to adsorb trimethylaluminum on the surface of the gate electrode; removing excess trimethylaluminum by an inert gas, in which the inert gas may be argon; and oxidizing the trimethylaluminum adsorbed on the surface of the gate electrode by oxygen to form an aluminum oxide layer.

For example, the modified layer is formed to have a thickness of 10 nm or less.

In the process of forming the modified layer on the side of the metal oxide layer away from the gate electrode through self-assembling, the material of the modified layer may be silazane or chlorosilane. In this case, the forming the modified layer on the side of the metal oxide layer away from the gate electrode through self-assembling may include: treating a surface of the metal oxide layer away from the gate electrode with silazane or chlorosilane, to form the modified layer.

For example, the treating the surface of the metal oxide layer with silazane or chlorosilane can be performed by vapor deposition or solution coating, so that the silazane or chlorosilane can be self-assembled with the metal oxide.

For example, the silazane may be hexamethyldisilazane. When the material of the modified layer is hexamethyldisilazane, the forming the modified layer may include: treating a surface of the metal oxide layer away from the gate electrode with hexamethyldisilazane vapor or a solution containing hexamethyldisilazane, to form the modified layer.

In some embodiments of the present disclosure, the gate insulation layer may further include an adhesion layer arranged between the metal oxide layer and the modified layer.

When a gate insulation layer having this structure is to be formed, in the method for preparing the thin film transistor according to the embodiment of the present disclosure, the forming the gate insulation layer further includes: after forming the metal oxide layer on the gate surface and before forming the modified layer, forming the adhesion layer on a surface of the metal oxide layer away from the gate electrode, in which the forming the modified layer includes forming a modified layer on a surface of the adhesion layer away from the gate electrode. For example, the adhesion layer has a thickness of 10 nm to 20 nm.

For example, the material of the adhesion layer may be polymethylsilsesquioxane When the material of the adhesion layer is polymethylsilsesquioxane and the material of the modified layer is silazane or chlorosilane, the forming the gate insulation layer may include: forming a metal oxide layer on the surface of the gate electrode; coating a solution containing polymethylsilsesquioxane on a surface of the metal oxide layer away from the gate electrode and then vacuum drying to form the adhesion layer; performing plasma treatment on the adhesion layer to obtain a hydrophilic surface; and treating the hydrophilic surface with silazane or chlorosilane to form the modified layer.

For example, when the material of the modified layer is hexamethyldisilazane, the forming the gate insulation layer may include: forming a metal oxide layer on the surface of the gate electrode; coating a solution containing polymethylsilsesquioxane on a surface of the metal oxide layer away from the gate electrode and then vacuum drying to form the adhesion layer; performing plasma treatment on the adhesion layer to obtain a hydrophilic surface; and treating the hydrophilic surface with hexamethyldisilazane vapor or a solution containing hexamethyldisilazane, to form the modified layer.

For example, when the gate insulation layer includes an aluminum oxide layer, an adhesion layer formed of polymethylsilsesquioxane, and a modified layer formed of hexamethyldisilazane, the forming the gate insulation layer may include: forming an aluminum oxide layer on a surface of the gate electrode; coating a solution containing polymethylsilsesquioxane on a surface of the aluminum oxide layer away from the gate electrode and then vacuum drying to form the adhesion layer; performing plasma treatment on the adhesion layer to obtain a hydrophilic surface; and treating the hydrophilic surface with hexamethyldisilazane vapor or a solution containing hexamethyldisilazane to form the modified layer.

In the method for preparing the gate insulation layer in the embodiment of the present disclosure, the adhesion layer formed of polymethylsilsesquioxane and the modified layer formed of hexamethyldisilazane on the surface of the aluminum oxide layer are sequentially modified by the self-assembly method. The method is simple, the reaction efficiency is good, and the layers are tightly combined.

For example, the forming the gate insulation layer further includes forming a via hole for exposing the gate electrode in the gate insulation layer.

S4: forming a semiconductor layer on a gate insulation layer, an orthogonal projection of the semiconductor layer on the base substrate falling within an orthogonal projection of the gate electrode on the base substrate.

The semiconductor layer can be made of amorphous silicon (a-Si), low temperature polysilicon (LTPS), indium gallium zinc oxide (IGZO), etc.

A semiconductor layer may be formed on the gate insulation layer. The forming the semiconductor layer may include depositing a semiconductor thin film on the modified layer, to obtain a semiconductor layer after a patterning process.

If a via hole is formed in a gate insulation layer composed of a metal oxide layer and a modified layer, for example, a semiconductor thin film is also deposited at the exposed via hole for exposing the gate electrode and a semiconductor layer is formed after a patterning process, thereby preventing subsequent deposition of the source electrode and the drain electrode in direct contact with the gate electrode.

The semiconductor layer can have a thickness of 100 nm or more.

S5: forming a source electrode and a drain electrode on a base substrate on which the semiconductor layer is formed to obtain a thin film transistor.

The source electrode and the drain electrode may include metals, such as Al, Cu, Ti, and Cr.

The method for preparing the source electrode and the drain electrode may include depositing a source/drain electrode layer, and forming a source and a drain after a patterning process.

For example, the source electrode and the drain electrode are arranged on the semiconductor layer to minimize the parasitic capacitance.

After forming the source electrode and the drain electrode, for example, an encapsulation layer can be deposited, and then a thin film transistor is obtained. The encapsulation layer can be silicon nitride of 500 nm or more.

If it is necessary to form a via hole, for example, the encapsulation layer, the semiconductor layer, and the gate insulation layer are etched by a dry etching process, to form a via hole at an appropriate position of the gate electrode. The encapsulation layer can also be etched by a dry etching process, to form a via hole at an appropriate position on the source electrode.

An embodiment of the present disclosure also provides a display substrate including the thin film transistor as described above.

An embodiment of the present disclosure further provides a display device including the display substrate as described above.

Regarding the display substrate and/or display device using the thin film transistor described in the present disclosure, the on-state current is high due to the large capacitance of the thin film transistor, thereby greatly reducing the driving voltage of the gate electrode and the load of the peripheral driving circuit, thereby reducing the power consumption of the display substrate or the display device and achieving a higher energy efficiency ratio.

An embodiment of the present disclosure further provides a display substrate including the thin film transistor as described above. The display substrate may be an LCD or OLED display substrate based on a glass substrate. In addition, since the modified layer and/or the adhesion layer are formed on the metal oxide layer through self-assembly, the high temperature chemical vapor deposition process is avoided, and thus it is suitable for use in organic flexible substrates.

An embodiment of the present disclosure further provides a display device including the display substrate as described above.

In order to further understand the present disclosure, the method for producing the thin film transistor provided by the present disclosure will be described detailedly in the following Examples, but the protection scope of the present disclosure is not limited by the following embodiments.

In some embodiments of the present disclosure, as shown in FIGS. 5 to 10, a method for preparing a thin film transistor includes providing a glass substrate as the base substrate 1.

Figure 5:
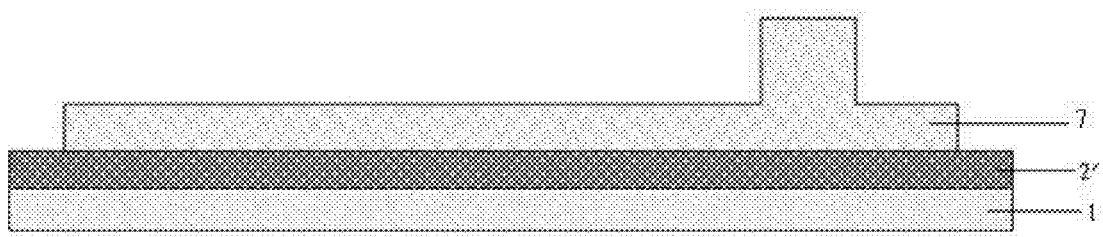
FIGS. 5 to 10 are schematic views showing the transistor formed in each step in a method for preparing a thin film transistor.

In addition, a gate metal thin film 2' formed of aluminum is deposited on a glass substrate, a layer of photoresist 7 is coated on the gate metal thin film 2', and the photoresist 7 is exposed by using a mask to allow the photoresist 7 to form a photoresist unreserved region, a photoresist partially reserved region, and a photoresist reserved region. The photoresist reserved region corresponds to a region where the pattern of the gate electrode 2 is located, the photoresist partially reserved region corresponds to a region where the via hole is located, and the photoresist unreserved region corresponds to a region outside of the above pattern. An exemplary structure is shown in FIG. 5.

Figure 6:
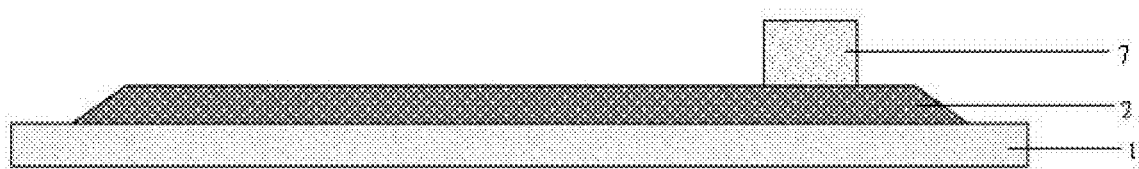

In addition, a development processing is performed, so that the photoresist 7 in the photoresist unreserved region is completely removed, and the thickness of the photoresist 7 in the photoresist reserved region remains unchanged. The gate metal thin film 2' of the photoresist unreserved region is completely etched by an etching process. The photoresist 7 of the photoresist partially reserved region is ashed away to form a photoresist pattern for protecting the via hole. The remaining photoresist 7 is stripped to form the pattern of the gate electrode 2. An exemplary structure is shown in FIG. 6.

In addition, the gate electrode 2 is directly oxidized in an oxygen plasma environment, to form an aluminum oxide layer on the surface of the gate electrode 2. The aluminum oxide layer may have a thickness of 5 nm to 50 nm.

In addition, a solution containing polymethylsilsesquioxane is coated on the surface of the aluminum oxide layer away from the gate electrode 2 and then vacuum dried, for example, at 5 to 20 Pa and 80° C., to form an adhesion layer.

Figure 7:
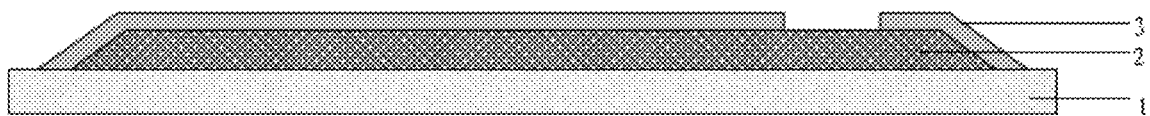

In addition, a plasma treatment is performed on the adhesion layer to obtain a hydrophilic surface, and the hydrophilic surface is treated with hexamethyldisilazane vapor or a solution containing hexamethyldisilazane to form the modified layer. Thus, the aluminum oxide layer, the adhesion layer, and the modified layer together constitute the gate insulation layer 3. An exemplary structure is shown in FIG. 7.

Figure 8:
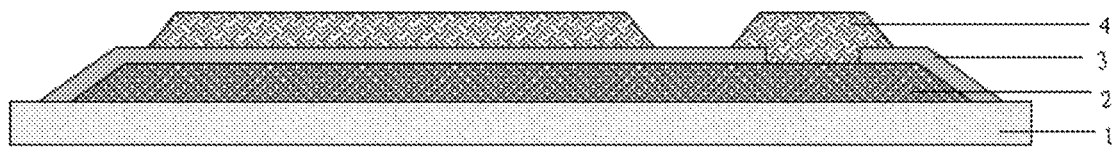

In addition, a semiconductor thin film is deposited on the glass substrate that has completed the above operations, a layer of photoresist is coated on the semiconductor thin film, and the photoresist is exposed by using a mask to form a photoresist unreserved region and a photoresist reserved region. The photoresist reserved region corresponds to a region where the pattern of the semiconductor layer 4 is located, and the photoresist unreserved region corresponds to a region outside of the above pattern. The development processing is performed, so that the photoresist in the photoresist unreserved region is completely removed, and the thickness of the photoresist in the photoresist reserved region remains unchanged. The semiconductor metal film of the photoresist unreserved region is completely etched away by an etching process, and the remaining photoresist is stripped to form a semiconductor layer 4. An exemplary structure is shown in FIG. 8.

Figure 9:
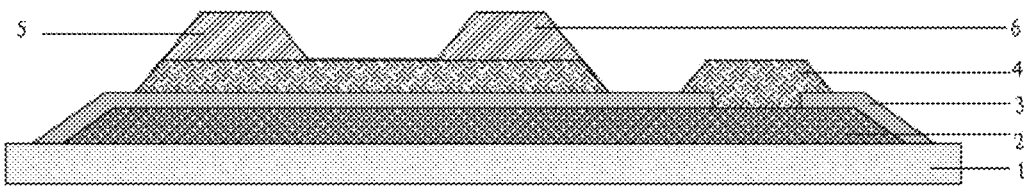

In addition, after a source/drain metal layer is deposited on the glass substrate that has completed the above operations, the source/drain metal layer may be metals such as Cu, Al, Ag, Mo, Cr, Nd, Ni, Mn, Ti, Ta, W, and alloys of these metals. The source/drain metal layer may be a single layer structure or a multilayer structure, such as Cu\Mo, Ti\Cu\Ti, and Mo\Al\Mo. A layer of photoresist is coated on the source/drain metal layer, and the photoresist is exposed by using a mask to form a photoresist unreserved region and a photoresist reserved region. The photoresist reserved region corresponds to a region in which the pattern of the source electrode 5/the drain electrode 6 is located, and the photoresist unreserved region corresponds to a region outside of the above pattern. The development processing is performed, so that the photoresist in the photoresist unreserved region is completely removed, and the thickness of the photoresist in the photoresist reserved region remains unchanged. The source/drain metal layer of the photoresist unreserved region is completely etched away by an etching process, and the remaining photoresist is stripped to form a pattern of the drain electrode and the source electrode. An exemplary structure is shown in FIG. 9.

Figure 10:
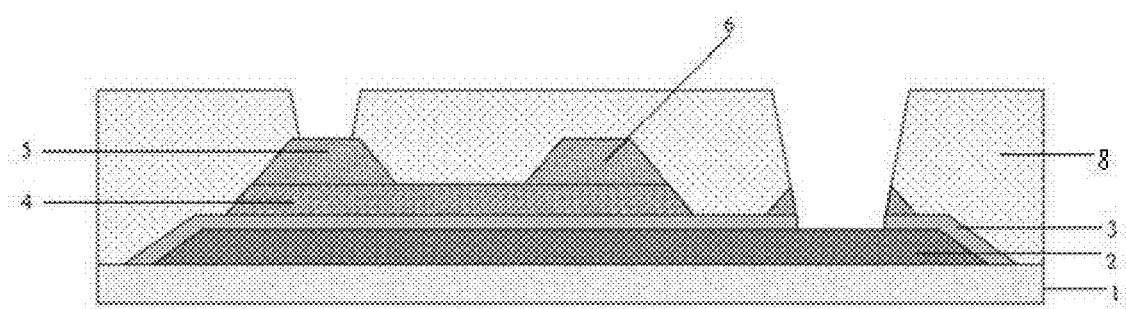

In addition, when the encapsulation layer 8 is deposited, the encapsulation layer 8, the semiconductor layer 4, and the gate insulation layer 3 are etched by a dry etching process, to form a via hole at an appropriate position of the gate electrode 2. At the same time, the encapsulation layer 8 is etched by a dry etching process to form a via hole at an appropriate position of the source electrode 5, thereby obtaining a thin film transistor. An exemplary structure is shown in FIG. 10.

In some embodiments of the present disclosure, a method for preparing a thin film transistor includes the following steps.

A glass substrate is provided.

An aluminum thin film is deposited on the glass substrate, a layer of photoresist is coated on the aluminum thin film, and the photoresist is exposed by using a mask to allow the photoresist to form a photoresist unreserved region, a photoresist partially reserved region, and a photoresist reserved region. The photoresist reserved region corresponds to a region where the pattern of the gate electrode is located, the photoresist partially reserved region corresponds to a region where the via hole is located, and the photoresist unreserved region corresponds to a region outside of the above pattern.

A development processing is performed, so that the photoresist in the photoresist unreserved region is completely removed, and the thickness of the photoresist in the photoresist reserved region remains unchanged. The aluminum thin film of the photoresist unreserved region is completely etched by an etching process, and the photoresist of the photoresist partially reserved region is ashed to form a photoresist pattern for protecting the via hole; and the remaining photoresist is stripped to form a pattern of the gate electrode.

The gate electrode is directly oxidized in an oxygen plasma environment, to form an aluminum oxide layer on the surface of the gate electrode, and the aluminum oxide layer can have a thickness of 5 nm to 50 nm.

The surface of the aluminum oxide layer away from the gate is treated with hexamethyldisilazane vapor or a solution containing hexamethyldisilazane to form the modified layer. Thus, the aluminum oxide layer, and the modified layer together constitute the gate insulation layer.

A semiconductor thin film is deposited on the glass substrate that has completed the above operations, a layer of photoresist is coated on the semiconductor thin film, and the photoresist is exposed by using a mask to form a photoresist unreserved region and a photoresist reserved region. The photoresist reserved region corresponds to a region where the pattern of the semiconductor layer is located, and the photoresist unreserved region corresponds to a region outside of the above pattern. A development processing is performed, so that the photoresist in the photoresist unreserved region is completely removed, and the thickness of the photoresist in the photoresist reserved region remains unchanged. The semiconductor metal film of the photoresist unreserved region is completely etched away by an etching process, and the remaining photoresist is stripped to form a semiconductor layer.

After a source/drain metal layer is deposited on the glass substrate that has completed the above operations, the source/drain metal layer may be metals such as Cu, Al, Ag, Mo, Cr, Nd, Ni, Mn, Ti, Ta, W, and alloys of these metals. The source/drain metal layer may be a single layer structure or a multilayer structure, such as Cu\Mo, Ti\Cu\Ti, and Mo\Al\Mo. A layer of photoresist is coated on the source/drain metal layer, and the photoresist is exposed by using a mask to form a photoresist unreserved region and a photoresist reserved region. The photoresist reserved region corresponds to a region in which the pattern of the source/drain electrode is located, and the photoresist unreserved region corresponds to a region outside of the above pattern. A development processing is performed, so that the photoresist in the photoresist unreserved region is completely removed, and the thickness of the photoresist in the photoresist reserved region remains unchanged. The source/drain metal layer of the photoresist unreserved region is completely etched away by an etching process, and the remaining photoresist is stripped to form a pattern of the drain electrode and the source electrode.

When the encapsulation layer is deposited, the encapsulation layer, the semiconductor layer, and the gate insulation layer are etched by a dry etching process, to form a via hole at an appropriate position for exposing the gate electrode. At the same time, the encapsulation layer is etched by a dry etching process to form a via hole at an appropriate position of the source electrode, thereby obtaining a thin film transistor.

The description of the above Examples is merely used for helping to understand the technical solutions and technical concepts of the present disclosure. It should be noted that a person skilled in the art may make further improvements and modifications to the disclosure without departing from the principle/spirit of the present disclosure, and these improvements and modifications shall also fall within the scope of the present disclosure.

The above description of the disclosed Examples allows one skilled in the art to implement or use the present disclosure. Various modifications to these Examples would be apparent to one skilled in the art, and the general principles defined herein may be applied to other Examples without departing from the spirit or scope of the disclosure. Therefore, the present disclosure will not be limited to the Examples shown herein, but should cover the widest scope consistent with the principles and novel features disclosed herein.

The above description is alternative embodiments of the present disclosure. It should be noted that one skilled in the art would make several improvements and substitutions without departing from the principles of the present disclosure. These improvements and modifications should also be regarded as the protection scope of the present disclosure.

The invention claimed is:

1. A thin film transistor, comprising a gate electrode, a semiconductor layer, and a gate insulation layer arranged between the gate electrode and the semiconductor layer, wherein the gate insulation layer comprises a metal oxide layer and a modified layer formed through self-assembling on a side of the metal oxide layer away from the gate electrode, wherein the gate insulation layer further comprises an adhesion layer between the modified layer and the metal oxide layer, and wherein the material of the metal oxide layer having the dielectric constant of 10 or more is cerium oxide or gadolinium oxide.

2. The thin film transistor of claim 1, wherein a material of the modified layer is silazane or chlorosilane.

3. The thin film transistor of claim 2, wherein the silazane is hexamethyldisilazane.

4. The thin film transistor of claim 1, wherein a material of the adhesion layer is polymethylsilsesquioxane.

5. The thin film transistor of claim 1, wherein the adhesion layer has a thickness of 10 nm to 20 nm, and the modified layer has a thickness of 10 nm or less.

6. The thin film transistor of claim 1, wherein a material of the metal oxide layer has a dielectric constant of 10 or more, and the metal oxide layer has a thickness of less than 200 nm; or a material of the metal oxide layer has a dielectric constant of 5 to 10, and the metal oxide layer has a thickness of 5 nm to 50 nm.

7. A method for preparing a thin film transistor, comprising:

providing a base substrate;

forming a gate electrode on the base substrate;

forming a gate insulation layer;

forming a semiconductor layer on the gate insulation layer, an orthogonal projection of the semiconductor layer on the base substrate falling within an orthogonal projection of the gate electrode on the base substrate; and forming a source electrode and a drain electrode on the base substrate on which the semiconductor layer is formed, to obtain a thin film transistor, wherein the forming the gate insulation layer comprises: forming a metal oxide layer on a surface of the gate electrode; and forming a modified layer through self-assembling on a side of the metal oxide layer away from the gate electrode, wherein the forming the gate insulation layer further comprises: after forming the metal oxide layer on the surface of the gate electrode and before forming the modified layer, forming the adhesion layer on a surface the metal oxide layer away from the gate electrode; and the forming the modified layer comprises forming the modified layer on a surface of the adhesion layer away from the gate electrode, and wherein the material of the metal oxide layer having the dielectric constant of 10 or more is cerium oxide or gadolinium oxide.

8. The method of claim 7, wherein the forming the modified layer comprises: treating a surface of the metal oxide layer away from the gate electrode with silazane or chlorosilane, to form the modified layer.

9. The method of claim 8, wherein a material of the modified layer is hexamethylsilazane, and the forming the modified layer comprises:

treating a surface of the metal oxide away from the gate electrode with hexamethyldisilazane vapor or a solution containing hexamethyldisilazane, to form the modified layer.

10. The method of claim 7, wherein a material of the adhesion layer is polymethylsilsesquioxane, and the forming of the gate insulation layer comprises:

forming a metal oxide layer on a surface of the gate insulating;

coating a solution containing polymethylsilsesquioxane on a surface of the metal oxide layer away from the gate electrode and then vacuum drying to form the adhesion layer;

performing plasma treatment on the adhesion layer to obtain a hydrophilic surface; and treating the hydrophilic surface with silazane or chlorosilane to form the modified layer.

11. The method of claim 7, wherein a material of the metal oxide layer is a material having a dielectric constant of 10 or more, and the metal oxide layer is formed to have a thickness of less than 200 nm; or a material of the metal oxide layer is a material having a dielectric constant of 5 to 10, and the metal oxide layer is formed to have a thickness of 5 nm to 50 nm.

12. The method of claim 11, wherein the material of the metal oxide layer is aluminum oxide, and the forming the metal oxide layer on the surface of the gate electrode comprises:

forming an aluminum oxide layer on the surface of the gate electrode by oxygen plasma direct oxidation, PECVD, or atomic layer deposition.

13. The method of claim 11, wherein the material of the gate electrode is aluminum, the material of the metal oxide layer is aluminum oxide, and the forming the metal oxide layer on the surface of the gate electrode comprises: forming an aluminum oxide layer on the surface of the gate electrode by oxygen plasma oxidation.

14. The method of claim 12, wherein the forming the aluminum oxide layer on the surface of gate electrode by atomic layer deposition comprises:

treating the gate electrode with trimethylaluminum, to adsorb trimethylaluminum on the surface of the gate electrode;

removing excess trimethylaluminum with an inert gas; and oxidizing the trimethylaluminum adsorbed on the surface of the gate electrode by oxygen to form an aluminum oxide layer.

15. The method of claim 7, wherein the adhesion layer is formed to have a thickness of 10 nm to 20 nm, and the modified layer is formed to have a thickness of less than 10 nm.

16. A display substrate, comprising the thin film transistor of claim 1.

17. A display device comprising the display substrate of claim 16.

* * * * *